United States Patent
Lin et al.

(10) Patent No.: US 10,621,897 B2
(45) Date of Patent: Apr. 14, 2020

(54) DISPLAY DEVICE WITH PROJECTION FUNCTION AND DISPLAY METHOD THEREOF

(71) Applicants: Hsiu-Hang Lin, Taipei (TW); Pin-Yu Chou, Taipei (TW); Kai-Yi Chen, Taipei (TW); Kun-Hsuan Chang, Taipei (TW); Hsin-Chieh Cheng, Taipei (TW); Yu-Hao Tseng, Taipei (TW); Chia-Shin Weng, Taipei (TW); Dai-Yun Tsai, Taipei (TW)

(72) Inventors: Hsiu-Hang Lin, Taipei (TW); Pin-Yu Chou, Taipei (TW); Kai-Yi Chen, Taipei (TW); Kun-Hsuan Chang, Taipei (TW); Hsin-Chieh Cheng, Taipei (TW); Yu-Hao Tseng, Taipei (TW); Chia-Shin Weng, Taipei (TW); Dai-Yun Tsai, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 28 days.

(21) Appl. No.: 15/987,906

(22) Filed: May 24, 2018

(65) Prior Publication Data
US 2018/0357942 A1    Dec. 13, 2018

Related U.S. Application Data

(60) Provisional application No. 62/510,731, filed on May 24, 2017.

(51) Int. Cl.
*G09G 3/00*    (2006.01)
*G06F 3/01*    (2006.01)
(Continued)

(52) U.S. Cl.
CPC .............. *G09G 3/002* (2013.01); *G03B 17/54* (2013.01); *G03B 21/10* (2013.01); *G03B 21/142* (2013.01);
(Continued)

(58) Field of Classification Search
CPC ........ G09G 3/002; G09G 3/001; G09G 3/003; H04N 9/3194; H04N 9/3179;
(Continued)

(56) References Cited

U.S. PATENT DOCUMENTS

| 2014/0035850 A1* | 2/2014 | Shin ...................... G06F 3/041 345/173 |
| 2014/0298271 A1* | 10/2014 | Jakubiak ............. G06F 3/04883 715/856 |

(Continued)

FOREIGN PATENT DOCUMENTS

| TW | M355612 | 5/2009 |
| TW | M445115 | 1/2013 |

(Continued)

OTHER PUBLICATIONS

"Office Action of Taiwan Counterpart Application", dated Jun. 28, 2019, pp. 1-8.

*Primary Examiner* — Rodney Amadiz
(74) *Attorney, Agent, or Firm* — JCIPRNET

(57) ABSTRACT

A display device and a display method are provided. The display device comprises a housing, a translucent module, a projecting unit and an object detection sensor. The housing comprises a containing space. The translucent module is disposed on the surface of the housing. The projecting unit is disposed in the containing space, and coupled to a controller. The projecting unit is configured to project projection light to the translucent module. The object detection sensor is disposed on the display device and coupled to the
(Continued)

controller. When the object detection sensor senses that a moving object exists in a first preset distance range away from the housing, the object detection sensor outputs an object sensing signal to the controller. The controller controls the projecting unit and the translucent module based on the object sensing signal, so as to project a projection picture.

27 Claims, 10 Drawing Sheets

(51) Int. Cl.
*G03B 21/14* (2006.01)
*G03B 21/28* (2006.01)
*H04N 9/31* (2006.01)
*G03B 21/10* (2006.01)
*G03B 17/54* (2006.01)
*H05K 5/00* (2006.01)
*H05K 5/02* (2006.01)
*H04N 13/398* (2018.01)
*H04N 13/363* (2018.01)

(52) U.S. Cl.
CPC ............ *G03B 21/28* (2013.01); *G06F 3/013* (2013.01); *G09G 3/001* (2013.01); *H04N 9/3179* (2013.01); *H04N 9/3194* (2013.01); *H05K 5/0017* (2013.01); *H05K 5/0217* (2013.01); *H05K 5/0234* (2013.01); *G03B 21/145* (2013.01); *G06F 3/017* (2013.01); *G09G 3/003* (2013.01); *H04N 13/363* (2018.05); *H04N 13/398* (2018.05)

(58) Field of Classification Search
CPC .... H04N 13/363; H04N 13/398; G03B 21/10; G03B 17/54; G03B 21/28; G03B 21/142; G03B 21/145; H05K 5/0017; H05K 5/0234; H05K 5/0217; G06F 3/013; G06F 3/017
See application file for complete search history.

(56) References Cited

U.S. PATENT DOCUMENTS

2015/0092266 A1* 4/2015 Yeremian ............... G03B 21/10
 359/443
2018/0113598 A1* 4/2018 Linder ............... G05B 19/4065

FOREIGN PATENT DOCUMENTS

| TW | M452294 | 5/2013 |
| TW | 201419936 | 5/2014 |
| TW | M481464 | 7/2014 |
| TW | M520160 | 4/2016 |
| TW | M526704 | 8/2016 |
| TW | 201741757 | 12/2017 |

* cited by examiner

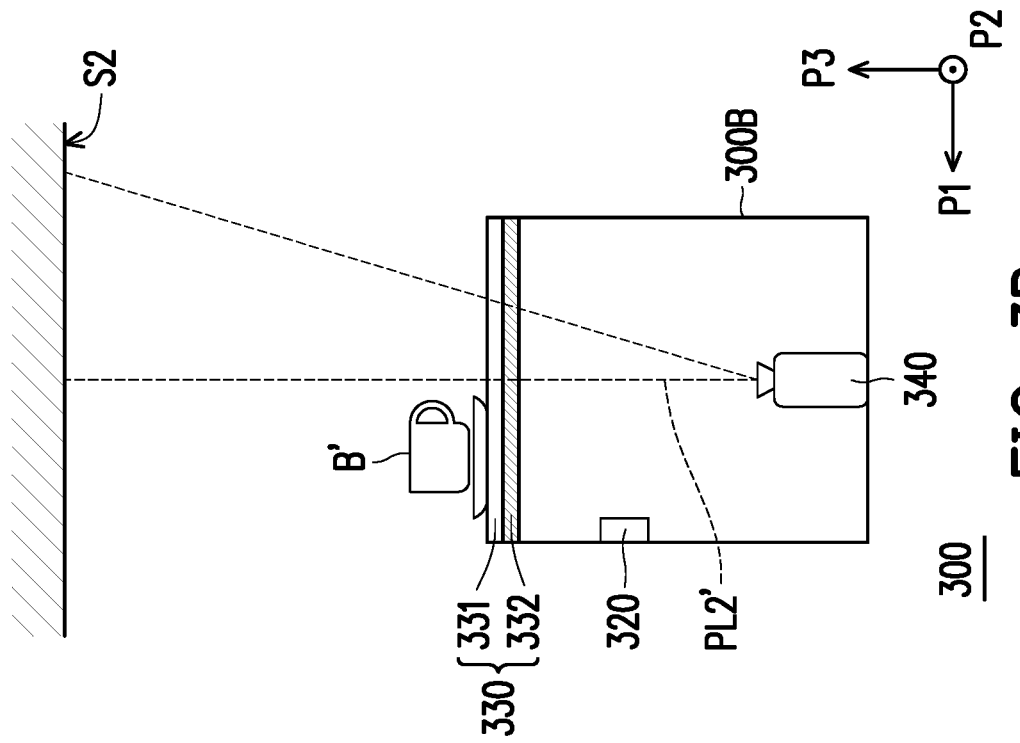
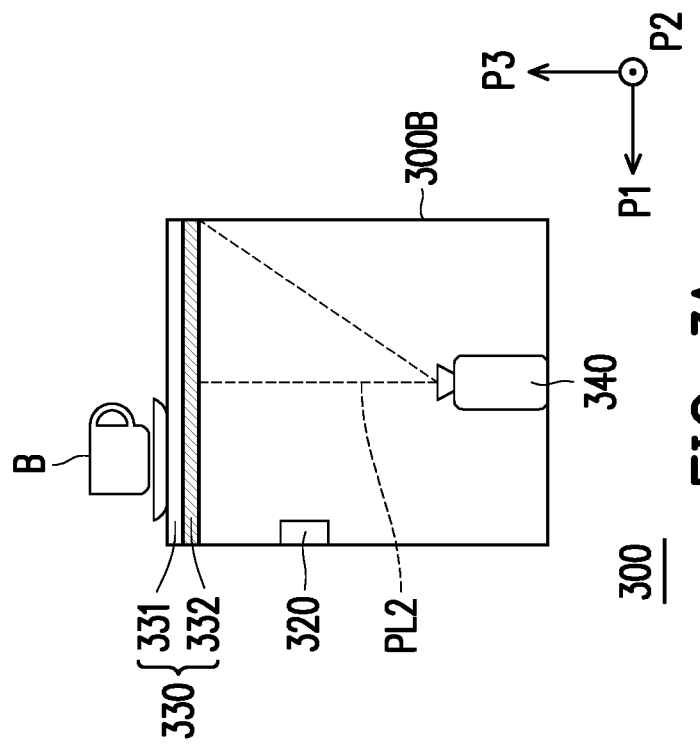
FIG. 3B
FIG. 3A

DISPLAY DEVICE WITH PROJECTION FUNCTION AND DISPLAY METHOD THEREOF

CROSS-REFERENCE TO RELATED APPLICATION

This application claims the priority benefit of U.S. provisional application Ser. No. 62/510,731, filed on May 24, 2017. The entirety of the above-mentioned patent application is hereby incorporated by reference herein and made a part of this specification.

BACKGROUND OF THE INVENTION

1. Field of the Invention

The present invention relates to a display technology, and particularly relates to a display device with a projection function and a display method.

2. Description of Related Art

Generally, a display device with a projection function means that a projector is configured to project an image picture to a projection surface, so that the corresponding projection picture is displayed on the projection surface. However, along with maturity of the projection technology, the manner of projecting the projection picture by only using a projector cannot meet current use requirements any more. For example, in order to obtain better use experience, if a user wants to apply the projection function to special image information display, a table capable of displaying special images or a floor lamp having a projection function, how to design a display device capable of effectively providing various above-mentioned projection effects needs to be achieved by design of a special display device. Therefore, solutions of several embodiments will be proposed in the following.

SUMMARY OF THE INVENTION

The present invention provides a display device and a display method, which can determine whether to project a projection picture by determining whether a movable object exists around the housing of the display device, so as to provide good user experience.

The display device provided by the present invention comprises a housing, a translucent module, a projecting unit and an object detection sensor. The housing comprises a containing space. The translucent module is disposed on the surface of the housing. The projecting unit is disposed in the containing space, and coupled to a controller. The projecting unit is configured to project projection light to the translucent module. The object detection sensor is disposed on the display device and coupled to the controller. When the object detection sensor senses that a moving object exists in a first preset distance range away from the housing, the object detection sensor outputs an object sensing signal to the controller. The controller controls the projecting unit and the translucent module based on the object sensing signal, so as to project a projection picture.

A display method disclosed by the invention is applicable to the display method. The display device comprises a housing, a translucent module, a projecting unit and an object detection sensor. The display method comprises the following steps: sensing, by the object detection sensor, whether a moving object exists in a first preset distance range away from the housing; outputting, by the object detection sensor, an object sensing signal to a controller when the object detection sensor senses that the moving object exists in the first preset distance range away from the housing; and controlling, by the controller, the projecting unit and the translucent module based on the object sensing signal, so as to project a projection picture.

Based on the above contents, according to the display device and the display method provided by the present invention, whether a moving object exists in the first preset distance range away from the housing can be effectively determined by the object detection sensor, so as to determine whether to correspondingly project the projection picture. Therefore, the display device provided by the present invention can provide good user experience.

To make the abovementioned features and advantages of the present invention more comprehensible, embodiments are described in detail below with reference to the accompanying drawings.

BRIEF DESCRIPTION OF THE DRAWINGS

FIG. 3A and FIG. 3B are schematic diagrams indicating another two projection modes of the present invention.

DESCRIPTION OF THE EMBODIMENTS

Figure 1:
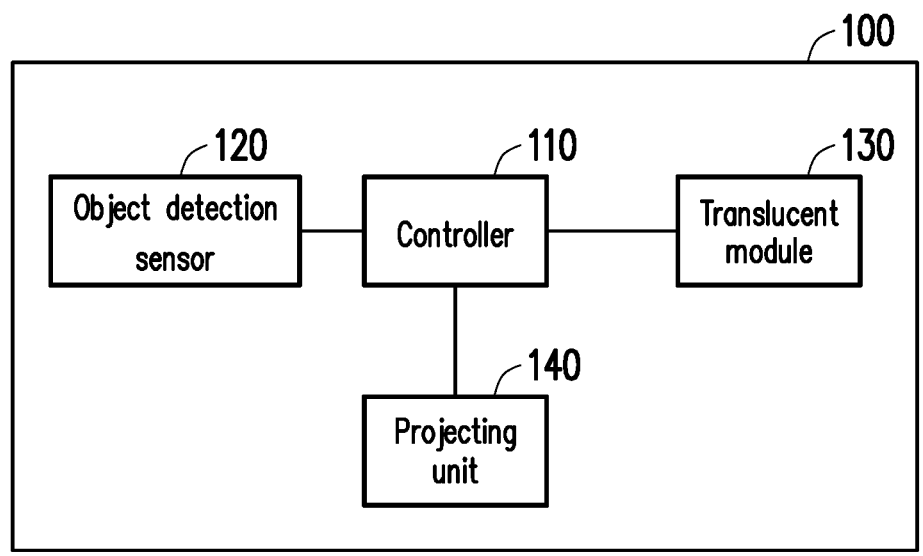
FIG. 1 is a block diagram indicating a display device of the present invention.

To make the contents of the present invention more easily and clearly understood, embodiments are described in detail below to serve as examples that can be really implemented by the present invention. Furthermore, wherever possible, elements/components/steps using same labels in the drawings and implementation modes represent same or similar parts.

FIG. 1 is a block diagram indicating a display device of the present invention. Referring to FIG. 1, the display device 100 comprises a controller 110, an object detection sensor 120, a translucent module 130 and a projecting unit 140. The controller 110 is coupled to the object detection sensor 120, the translucent module 130 and the projecting unit 140. In the present embodiment, the object detection sensor 120 is configured to sense whether a moving object (for example, a user) exists around the housing of the display device 100, so as to output an object sensing signal to the controller 110. When the object detection sensor 120 senses that the moving object exists around the housing of the display device 100, the controller 110 controls the projecting unit 140 and the translucent module 130 based on the object sensing signal, so as to project a projection picture. That is, the display device 100 of the present embodiment can selectively project the projection picture based on determination on whether the moving object exists around the housing. In the present embodiment, the housing of the display device 100 can be a mechanism form of a table or a cabinet.

In the present embodiment, the controller 110 can comprise a graphics processing unit (GPU), an image signal processor (ISP), a central processing unit (CPU), a system on chip (SOC), or other programmable microprocessors, digital signal processors (DSP), programmable controllers, application specific integrated circuits (ASIC) and programmable logic devices (PLD) for general purpose or special purpose, other similar processing units or a combination of these devices, but the present invention is not limited to this. Moreover, the display device 100 of the present invention can also comprise a memory. The memory is configured to store data, image processing program, control programs, etc. of the projection picture of each embodiment of the present invention, which are not limited by the present invention.

In the present embodiment, the object detection sensor 120 can be an infrared (IR) sensor or an ultrasound sensor and other like sensors. The object detection sensor 120 can sense a distance between the moving object and the housing of the display device 100, and can determine whether to output an object sensing signal to the controller 110 by determining the length of the distance. In the present embodiment, the projecting unit 140 can be a projector. The projecting unit 140 is configured to project the projection picture to the translucent module 130.

Figure 2B:
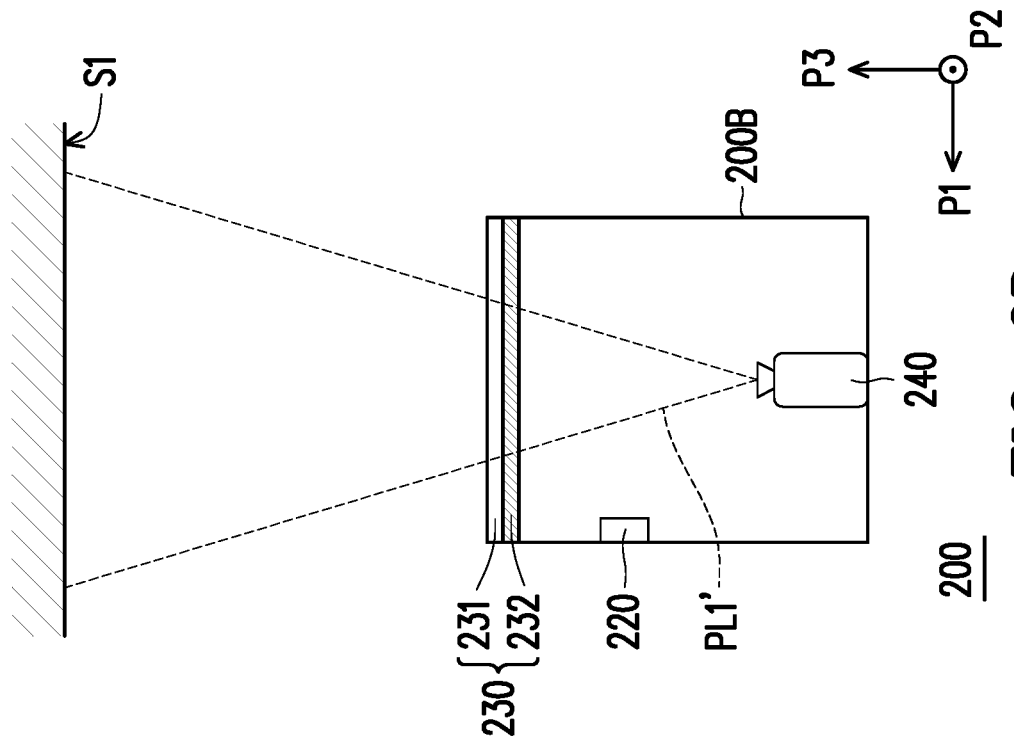
FIG. 2A FIG. 2B are schematic diagrams indicating two projection modes of the present invention.
Figure 2A:
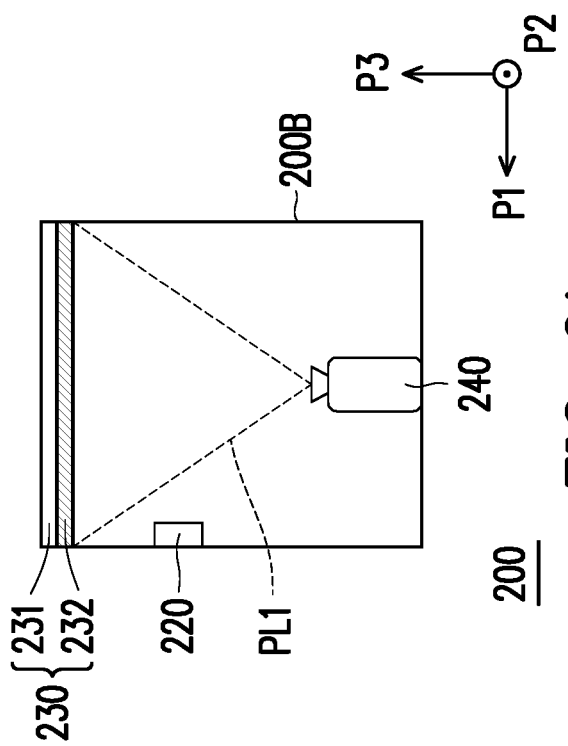

FIG. 2A and FIG. 2B are schematic diagrams indicating two projection modes of the present invention. Referring to FIG. 2A and FIG. 2B, a display device 200 comprises a housing 200B, an object detection sensor 220, a translucent module 230 and a projecting unit 240. The housing 200B comprises a containing space. The display device 200 can be placed on a horizontal plane defined by a first direction P1 and a second direction P2. The first direction P1, the second direction P2 and a third direction P3 are mutually vertical to one another. In the present embodiment, the object detection sensor 220 is disposed on the display device 200, particularly beside the housing 200B, but the position and quantity of the object detection sensor 220 on the display device 200 are not limited in the present invention. In one embodiment, the display device 200 can comprise multiple object detection sensors, which are disposed in the periphery of the inner side of the housing 200B by surrounding. The object detection sensors 220 sense towards the horizontal direction. In the present embodiment, the translucent module 230 is disposed on the surface of the housing 200B, and comprises a transparent substrate 231 and a dimming film 232. The projecting unit 240 is disposed in the containing space of the housing 200B, and projects towards the third direction P3 (projecting towards a vertical direction).

Specifically, referring to FIG. 2A, FIG. 2A is a schematic diagram of a projection mode of the present invention. When the object detection sensor 220 senses that the moving object exists in a first preset distance range away from the housing 200B, the object detection sensor 220 outputs an object sensing signal to the controller (not shown in the diagram), and the controller controls the projecting unit 240 and the dimming film 232 of the translucent module 230 based on the object sensing signal. In FIG. 2A, the controller of the display device 200 can further determine whether the moving object exists in a second preset distance range away from the housing 200B. The first preset distance range is greater than the second preset distance range. When the moving object exists in the second preset distance range away from the housing 200B, the controller of the display device 200 operates the dimming film 232 in a non-pervious state, so as to project projection light PL1 to the dimming film 232. That is, the display device 200 can be a table with a multilayer display function or a display cabinet with a projecting function. The controller of the display device 200 can turn down the light transmitting degree of the dimming film 232 in operation, so that the projection light PL1 projected by the projecting unit 240 can present the projection picture on the dimming film 232. For example, when the display device 200 determines that the user is very close to the housing 200B, the display device 200 can project the projection picture on the tabletop, so that the user can watch the projection picture on the tabletop (the transparent substrate 231).

Referring to FIG. 2B, FIG. 2B is a schematic diagram of a projection mode of the present invention. When the object detection sensor 220 senses that the moving object exists in the first preset distance range away from the housing 200B, the object detection sensor 220 outputs an object sensing signal to the controller, and the controller controls the projecting unit 240 and the dimming film 232 of the translucent module 230 based on the object sensing signal. In FIG. 2B, the controller of the display device 200 can further determine whether the moving object exists in the second preset distance range away from the housing 200B. The first preset distance range is greater than the second preset distance range. When the object detection sensor 220 senses that the moving object exists between the first preset distance range and the second preset distance range away from the housing 200B, the controller of the display device 200 operates the dimming film 232 in a translucent state, so that the projection light PL1' penetrates through the transparent substrate 231 and the dimming film 232 and projects the projection picture on a projection surface S1.

That is, the display device 200 can be a table with a multilayer display function or a display cabinet with a projecting function. The controller of the display device 200 can turn up the light transmitting degree of the dimming film 232 in operation, so that the projection light PL1' projected by the projecting unit 240 can present the projection picture on the projection surface S1. For example, when the display device 200 determines that the user moves to be near to the housing 200B and does not operate the display device 200, the display device 200 can project the projection picture on a ceiling, so that the display device 200 can provide a special display effect by projecting a specific projection picture (for example, projecting a special background image or advertisement image, etc.) on the ceiling.

FIG. 3A and FIG. 3B are schematic diagrams indicating another two projection modes of the present invention. Referring to FIG. 3A and FIG. 3B, a display device 300 comprises a housing 300B, an object detection sensor 320, a translucent module 330 and a projecting unit 340. The housing 300B comprises a containing space. In the present embodiment, the object detection sensor 320 is disposed on the display device 300, particularly beside the housing 300B, but the position and quantity of the object detection sensor 320 on the display device 300 are not limited in the present invention. The object detection sensor 320 senses towards a horizontal direction. In the present embodiment, the translucent module 330 is disposed on the surface of the housing 300B, and comprises a transparent substrate 331 and a dimming film 332. The projecting unit 340 is disposed in the containing space of the housing 300B, and projects towards the third direction P3 (projecting towards a vertical direction). It is noteworthy that the translucent module 330 of the present embodiment further comprises a pressure sensor (not shown in the diagram).

Specifically, referring to FIG. 3A, FIG. 3A is a schematic diagram of a projection mode of the present invention. When the object detection sensor 320 senses that the moving object exists in the first preset distance range away from the housing 300B, the object detection sensor 320 outputs an object sensing signal to the controller (not shown in the diagram), and the controller controls the projecting unit 340 and the dimming film 332 of the translucent module 330 based on the object sensing signal. Compared with FIG. 2A and FIG. 2B, in FIG. 3A, when the pressure sensor of the translucent module 330 senses that an article B (for example a cup) is loaded on the translucent module 330, the pressure sensor 320 outputs a pressure sensing signal to the controller, so that the controller controls the projecting unit 340 based on the pressure sensing signal, to adjust the projection range of the projecting unit 340, wherein the article B is not included in the projection range of projection light PL2.

In FIG. 3A, the controller of the display device 300 can further determine whether the moving object exists in the second preset distance range away from the housing 300B. The first preset distance range is greater than the second preset distance range. When the moving object exists in the second preset distance range away from the housing 300B, the controller of the display device 300 operates the dimming film 332 in a non-pervious state, so as to project the projection light PL2 to a partial area of the dimming film 332. That is, the display device 300 can be a table with a multilayer display function or a display cabinet with a projecting function. The controller of the display device 300 can turn down the light transmitting degree of the dimming film 332 in operation, so that the projection light PL2 projected by the projecting unit 340 can present the projection picture on a partial area of the dimming film 232. For example, when the display device 300 determines that the user is very close to the housing 300B or when the user operates the display device 300, the display device 300 can project the projection picture on the tabletop, so that the user can place, for example, a cup on the tabletop (the transparent substrate 231), and watch the projection picture in a region without the cup.

Referring to FIG. 3B, FIG. 3B is a schematic diagram of a projection mode of the present invention. When the object detection sensor 320 senses that the moving object exists in the first preset distance range away from the housing 300B, the object detection sensor 320 outputs an object sensing signal to the controller, and the controller controls the projecting unit 340 and the dimming film 332 of the translucent module 330 based on the object sensing signal. Compared with FIG. 2A and FIG. 2B, in FIG. 3B, when the pressure sensor of the translucent module 330 senses that an article B' is loaded on the translucent module 330, the pressure sensor outputs a pressure sensing signal to the controller, so that the controller controls the projecting unit 340 based on the pressure sensing signal, to adjust the projection range of the projecting unit 340, wherein the article B' is not included in the projection range of the projection light PL2'. In FIG. 3B, the controller of the display device 300 can further determine whether the moving object exists in the second preset distance range away from the housing 300B. The first preset distance range is greater than the second preset distance range. When the object detection sensor 320 senses that the moving objects exists between the first preset distance range and the second preset distance range away from the housing 300B, the controller of the display device 300 operates the dimming film 332 in a translucent state, so that the projection light PL2' penetrates through the transparent substrate 331 and the dimming film 332 and projects the projection picture on a partial area of a projection surface S2.

That is, the display device 300 can be a table with a multilayer display function or a display cabinet with a projecting function. The controller of the display device 300 can turn up the light transmitting degree of the dimming film 332 in operation, so that the projection light PL2' projected by the projecting unit 340 can present the projection picture on a partial area of the projection surface S2. For example, when the display device 300 determines that the user moves to be near to the housing 300B and does not operate the display device 300, the display device 300 can project the projection picture on a partial area of the ceiling, so that the display device 300 can provide a special display effect by projecting a specific projection picture (for example, projecting a special background image or advertisement image, etc.) to a partial area on the ceiling.

Furthermore, the pressure sensor can be, for example, integrated on the transparent substrate 331, and the quantity of the pressure sensor is not limited in the present invention. In one embodiment, the transparent substrate 331 can, for example, include multiple pressure sensors, and theses pressure sensors are disposed in an array in the transparent substrate. Or, in another embodiment, the transparent substrate 331 can also be a touch panel, so as to provide a touch control function or a pressure sensing function.

Figure 4:
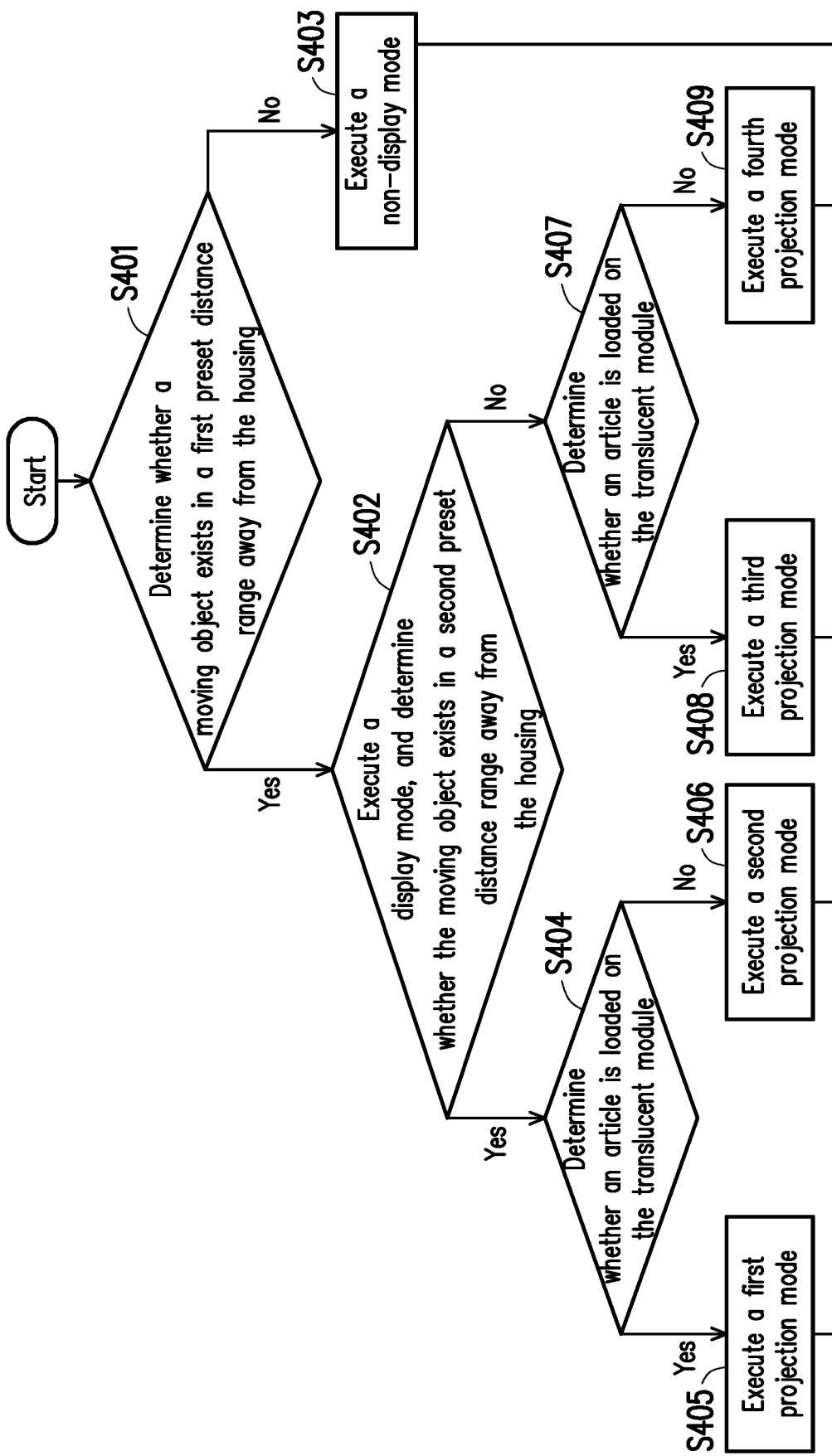
FIG. 4 is a flow diagram indicating a display method of the present invention.

FIG. 4 is a flow diagram indicating a display method of the present invention. Referring to FIG. 1 and FIG. 4, the display method of the present embodiment can be at least applicable to the display device 100 of the embodiment of FIG. 1. In step S401, the controller 110 senses the periphery of the display device 100 by the object detection sensor 120, so as to determine whether the moving object exists in the first preset distance range away from the housing. If so, the controller 100 executes step S402. If not, the controller 110 executes step S403. In step S402, the display device 100 executes a display mode, and the controller 110 further determines whether the moving object exists in the second preset distance range away from the housing. If so, the controller executes step S404. If not, the controller 110 executes step S407. However, in step S403, the controller 110 executes a non-display mode, so as to turn off the projecting unit 140.

In step S404, the controller 110 can determine whether an article is loaded on the translucent module 130 by the pressure sensor in the translucent module 130. If so, the controller 110 executes a first projection mode. The first projection mode is, for example, an implementation mode described in the embodiment of FIG. 3A. If not, the controller 110 executes a second projection mode. The second projection mode is, for example, an implementation mode described in the embodiment of FIG. 2A. In step S407, the controller 110 determines whether an article is loaded on the translucent module 130 by the pressure sensor in the translucent module 130. If so, the controller 110 executes a third projection mode. The third projection mode is, for example, an implementation mode described in the embodiment of FIG. 3B. If not, the controller 110 executes a fourth projection mode. The second projection mode is, for example, an implementation mode described in the embodiment of FIG. 3B. Therefore, the display device 100 of the present embodiment can effectively determine the distance between the moving object and the housing of the display device 100, so as to provide a corresponding display effect.

Figure 5:
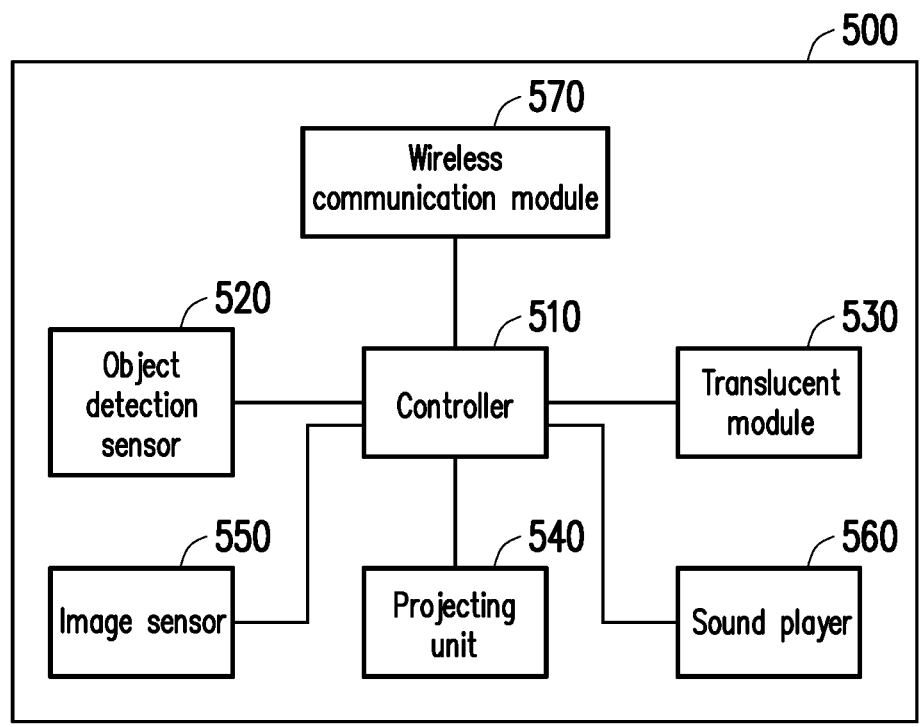
FIG. 5 is a block diagram indicating another display device of the present invention.

FIG. 5 is a block diagram indicating another display device of the present invention. Referring to FIG. 5, a display device 500 comprises a controller 510, an object detection sensor 520, a translucent module 530, a projecting unit 540, an image sensor 550, a sound player 560 and a wireless communication module 570. The controller 510 is coupled to the object detection sensor 520, the translucent module 530, the projecting unit 540, the image sensor 550, the sound player 560 and the wireless communication module 570. In the present embodiment, the object detection sensor 520 is configured to sense whether a moving object (for example, the user) exists in the periphery of the housing of the display device 500, so as to output an object sensing signal to the controller 510. The object detection sensor 520 senses towards the horizontal direction. When the object detection sensor 520 senses that the moving object exists in the periphery of the housing of the display device 500, the controller 510 controls the projecting unit 540 and the translucent module 530 based on the object sensing signal, so as to project the projection picture to the outside of the housing of the display device 500. That is, the display device 500 of the present embodiment can selectively project the projection picture based on determination on whether the moving object exists in the periphery of the housing.

Compared with the embodiment of FIG. 1, the display device 500 of the present embodiment further comprises the image sensor 550, the sound player 560 and the wireless communication module 570. In the present embodiment, the image sensor 550 is configured to sense a gesture image on the translucent module 530, so that the controller 510 analyzes the gesture image, to correspondingly adjust the content of the projection picture projected by the projecting unit 540. In the present embodiment, the sound player 560 is configured to correspondingly output sound information based on the content of the projection picture. In the present embodiment, the wireless communication unit 570 is configured to receive an operation instruction provided by an external electronic device, so that the controller 510 can adjust the content of the projection picture projected by the projecting unit 540 based on the operation instruction. Moreover, other implementation modes and technical details about the display device 500 of the present embodiment can refer to descriptions of the embodiment of FIG. 1 to obtain enough teachings, suggestions and implementation descriptions, and therefore, are omitted herein.

Figure 6:
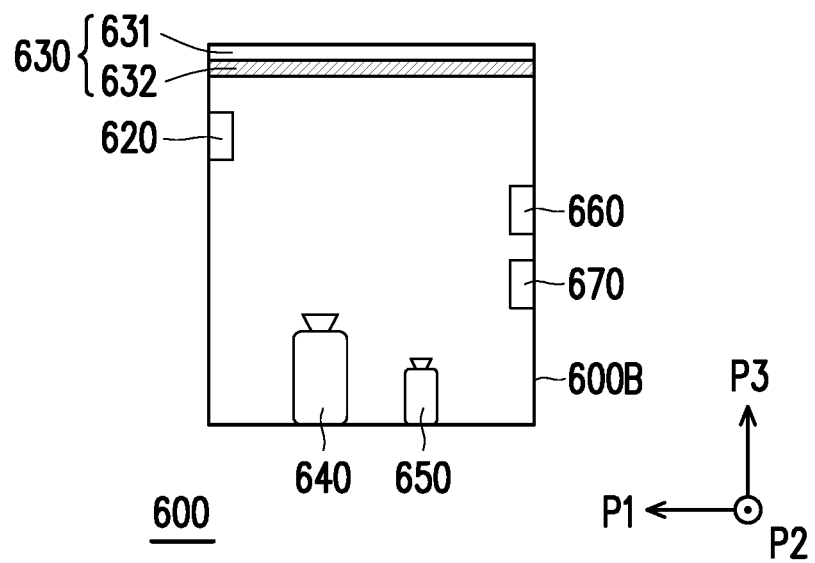
FIG. 6 is a schematic diagram indicating another display device of the present invention.

FIG. 6 is a schematic diagram indicating another display device of the present invention. Referring to FIG. 6, a display device 600 comprises a housing 600B, an object detection sensor 620, a translucent module 630, a projecting unit 640, an image sensor 650, a sound player 660 and a wireless communication module 670. The housing 600B has a containing space. The display device 600 can be placed on a horizontal plane defined by a first direction P1 and a second direction P2. The first direction P1, the second direction P2 and a third direction P3 are mutually vertical to one another. In the present embodiment, the object detection sensor 620 is disposed on the display device 600, particularly beside the housing 600B, but the position and quantity of the object detection sensor 620 on the display device 600 are not limited in the present invention. In the present embodiment, the translucent module 630 is disposed on the surface of the housing 600B, and comprises a transparent substrate 631 and a dimming film 632. The projecting unit 640 is disposed in the containing space of the housing 600B, and projects towards the third direction P3.

In the present embodiment, the image sensor 650 is disposed on the housing 600B, for example, the bottom of the housing 600B. The image sensor 650 can sense towards the translucent module 630. When the image sensor 650 senses a gesture of the user on the translucent module 630, the image sensor 650 outputs a gesture image to the controller (not shown in the diagram), so that the controller analyzes the gesture image, to correspondingly adjust the content of the projection picture projected by the projecting unit 640. In the present embodiment, the sound player 660 is disposed on the housing 600B, for example, beside the housing 600B. The sound player 660 can synchronously output sound information corresponding to the content of the projection picture projected by the projecting unit 640. In the present embodiment, the wireless communication module 670 can be in wireless communication connection with an external electronic device (not shown in the diagram), to receive an operation instruction provided by the external electronic device, so that the controller of the display device 600 adjusts the content of the projection picture projected by the projecting unit 640 based on the operation instruction. Therefore, the display device 600 of the present embodiment can further provide multiple interaction functions and control functions. Moreover, implementation modes and technical details about other projection modes of the display device 600 of the present embodiment can refer to descriptions of the embodiments of FIG. 2A to FIG. 4 to obtain enough teachings, suggestions and implementation descriptions, and therefore, are omitted herein.

Figure 7B:
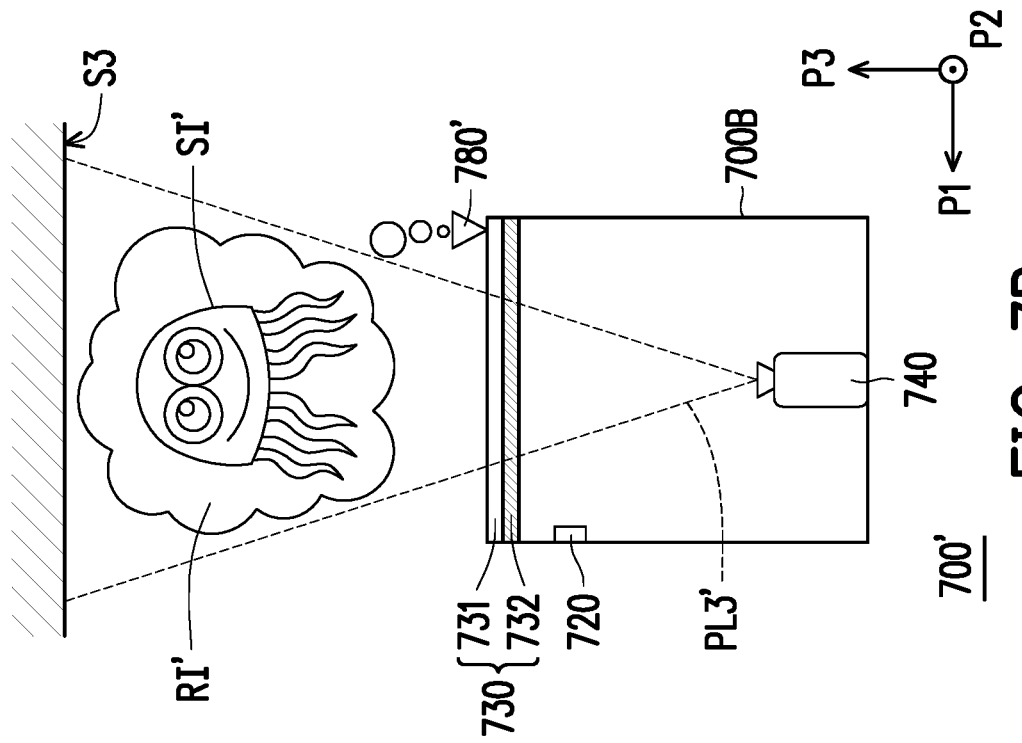
FIG. 7A and FIG. 7B are schematic diagrams indicating two stereoscopic projection modes of the present invention.
Figure 7A:
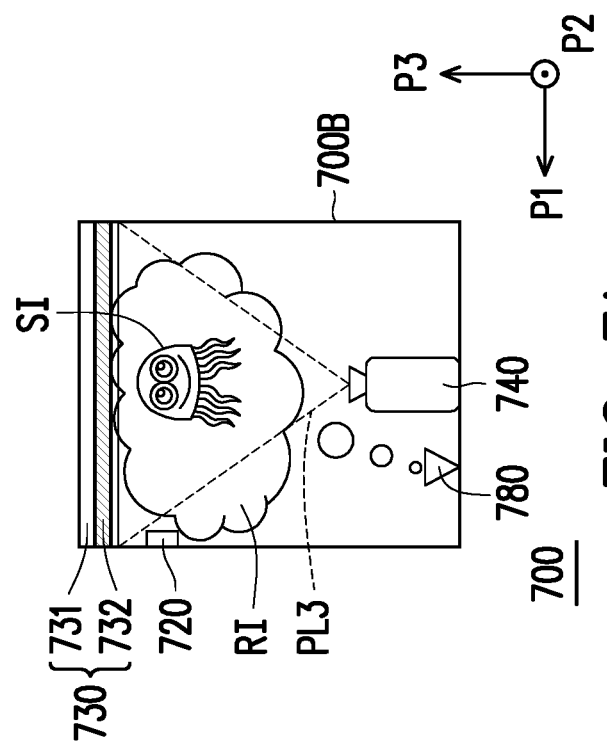

FIG. 7A and FIG. 7B are schematic diagrams indicating two stereoscopic projection modes of the present invention. Firstly, referring to FIG. 7A, a display device 700 comprises a controller 710, an object detection sensor 720, a translucent module 730, a projecting unit 740 and a medium providing module 780. A housing 700B comprises a containing space. The display device 700 can be placed on a horizontal plane defined by a first direction P1 and a second direction P2. The first direction P1, the second direction P2 and a third direction P3 are mutually vertical to one another. In the present embodiment, the object detection sensor 720 is disposed on the display device 700, particularly beside the housing 700B, but the position and quantity of the object detection sensor 720 on the display device 700 are not limited in the present invention. The object detection sensor 720 senses towards a horizontal direction. In one embodiment, the display device 700 can also comprise multiple object detection sensors, which are disposed in the periphery of the housing 700B by surrounding. In the present embodiment, the translucent module 730 is disposed on the surface of the housing 700B, and comprises a transparent substrate 731 and a dimming film 732. The projecting unit 740 is disposed in the housing 700B and projects towards the third direction P3.

It is noteworthy that, in FIG. 7A, the medium providing module 780 can be disposed in the containing space of the housing 700B, and the medium providing module 780 releases a refractive medium R1 in the containing space of the housing 700B, so that a stereoscopic projection picture SI can be displayed in the containing space of the housing 700B. In the present embodiment, the refractive medium R1 released by the medium providing module 780 can be, for example, specific gas or water vapor, etc., and it is not limited in the present invention. Therefore, when projection light PL3 projected by the projecting unit 740 passes through the refractive medium R1, the stereoscopic projection picture SI can be displayed in the area of the refractive medium RI. The display device 700 of the present embodiment can provide a stereoscopic display function.

The referring to FIG. 7B, a display device 700' comprises the controller 710, the object detection sensor 720, the translucent module 730, the projecting unit 740 and a medium providing module 780'. Compared with FIG. 7A, in FIG. 7B, the medium providing module 780' can be disposed on the translucent module 730, and the medium providing module 780' releases a refractive medium RI' outside the housing 700B, so that a stereoscopic projection picture SI' can be displayed above the translucent module 730. Therefore, when projection light PL3' projected by the projecting unit 740 is projected to a projection surface S3 by the refractive medium RI', the stereoscopic projection picture SI' can be displayed in the area of the refractive medium RI'. The display device 700' of the present embodiment can provide a stereoscopic display function. Moreover, implementation modes and technical details about other projection modes of the display devices 700 and 700' of the embodiments of FIG. 7A and FIG. 7B can refer to descriptions of the embodiments of FIG. 1 to FIG. 6 to obtain enough teachings, suggestions and implementation descriptions, and therefore, are not omitted herein.

Figure 8:
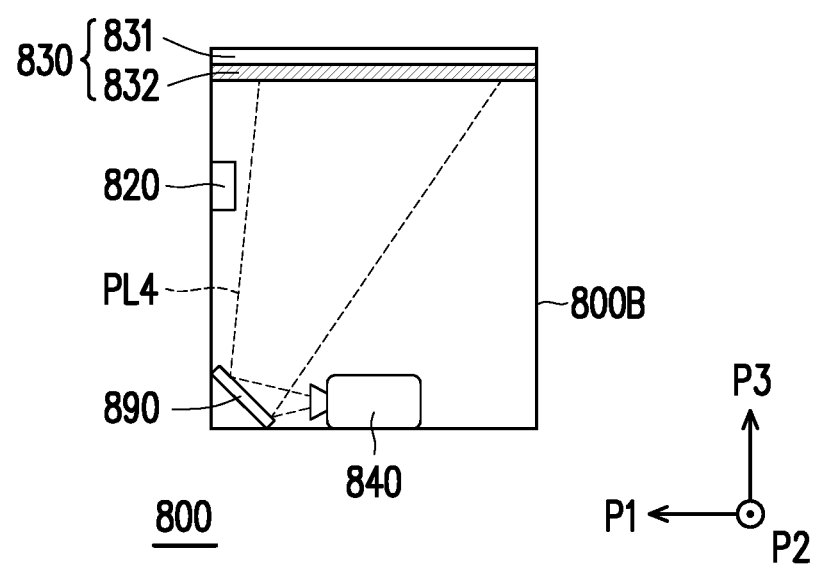
FIG. 8 is a schematic diagram of a display device with a reflecting element of the present invention.

FIG. 8 is a schematic diagram of a display device with a reflecting member of the present invention. Referring to FIG. 8, a display device 800 comprises a housing 800B, an object detection sensor 820, a translucent module 830, a projecting unit 840 and a reflecting member 890. The housing 800B comprises a containing space. The display device 800 can be placed on a horizontal plane defined by a first direction P1 and a second direction P2. The first direction P1, the second direction P2 and a third direction P3 are mutually vertical to one another. In the present embodiment, the object detection sensor 820 is disposed on the display device 800, particularly beside the housing 800B. In the present embodiment, the translucent module 830 is disposed on the surface of the housing 800B, and comprises a transparent substrate 831 and a dimming film 832.

It noteworthy that, compared with FIG. 2A, the projecting unit 840 and the reflecting member 890 are disposed at the bottom of the containing space of the housing 800B. The projecting unit 840 can project projection light PL4 towards the first direction P1 to the reflecting member 890, and the projection light PL4 is transmitted to the translucent module 830 after being reflected by the reflecting member 890. Therefore, the display device 800 provided by the present invention can more effectively utilize the containing space of the housing 800B. Moreover, implementation modes and technical details about other projection modes of the display device 800 of the present embodiment can refer to descriptions of the embodiments of FIG. 1 to FIG. 7B to obtain enough teachings, suggestions and implementation descriptions, and therefore, are omitted herein.

Figures 9A, 9B:
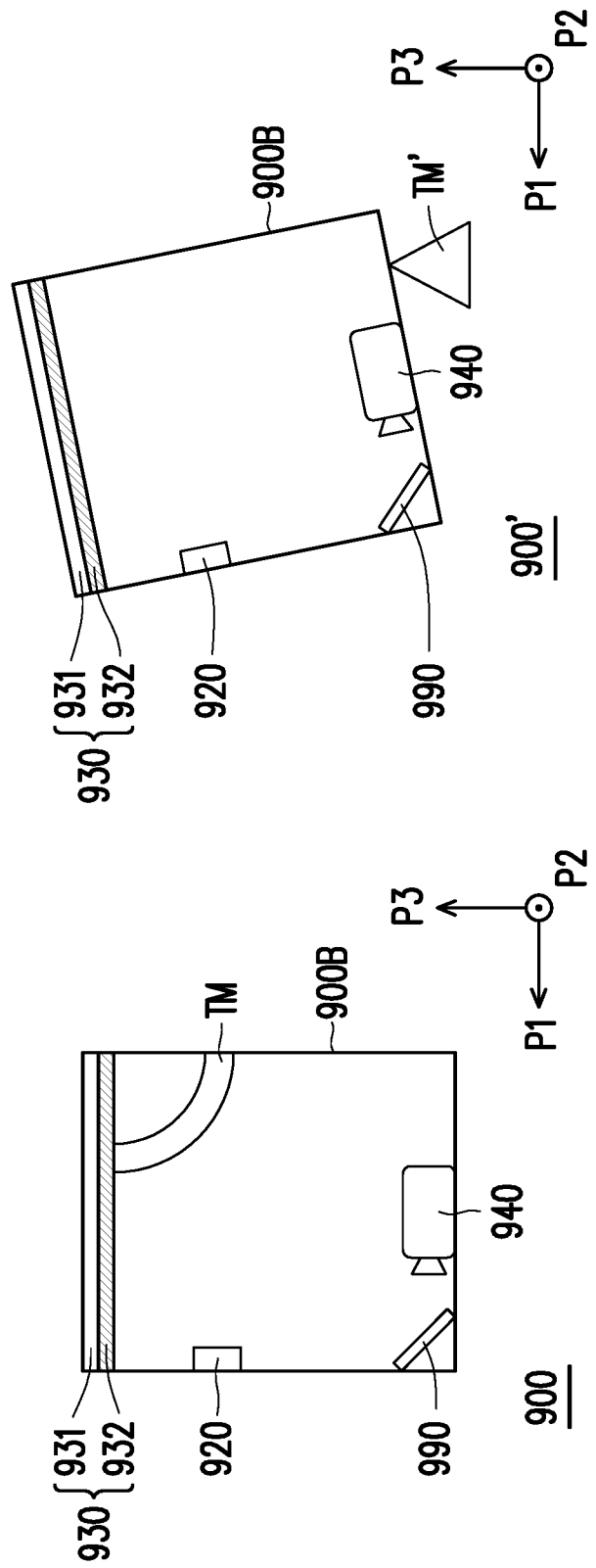
FIG. 9A and FIG. 9B are schematic diagrams indicating a display device with an inclining mechanism of the present invention.

FIG. 9A and FIG. 9B are schematic diagrams indicating a display device with an inclining mechanism of the present invention. First referring to FIG. 9A, a display device 900 comprises a housing 900B, an object detection sensor 920, a translucent module 930, a projecting unit 940, a reflecting member 990 and a first inclining mechanism TM. The housing 900B comprises a containing space. The display device 900 can be disposed on a horizontal plane defined by a first direction P1 and a second direction P2. The first direction P1, the second direction P2 and a third direction P3 are mutually vertical to one another. In the present embodiment, the object detection sensor 920 is disposed on the display device 900, particularly beside the housing 900B. In the present embodiment, the translucent module 930 is disposed on the surface of the housing 900B, and comprises a transparent substrate 931 and a dimming film 932.

It is noteworthy that, compared with FIG. 8, the first inclining mechanism TM can be disposed in the containing space of the housing 900B. The first inclining mechanism TM is coupled to the translucent module 930 and the side face of the housing 900B. The first inclining mechanism TM can be an arc-shaped inclining module, a linkage inclining module or a pulley inclining module, but is not limited in the present invention. An inclination angle can be formed between the translucent module 930 and the horizontal plane. The first inclining mechanism TM aims to make the translucent module 930 in a tiltable state, and the user can adjust the inclination angle of the translucent module 930 according to different use requirements. However, in one embodiment, the translucent module 930 can also be fixedly disposed to a tilted state, and the tilting degree of the translucent module 930 is not limited in the present invention. Therefore, the display device 900 of the present embodiment can correspondingly provide a suitable display angle according to different use requirements.

Then referring to FIG. 9B, a display device 900' comprises the housing 900B, the object detection sensor 920, the translucent module 930, the projecting unit 940, the reflecting member 990 and a second inclining mechanism TM'. The display device 900' can be disposed on a horizontal plane defined by a first direction P1 and a second direction P2. The first direction P1, the second direction P2 and a third direction P3 are mutually vertical to one another. In the present embodiment, the object detection sensor 920 is disposed on the display device 900, particularly beside the housing 900B. In the present embodiment, the translucent module 930 is disposed on the surface of the housing 900B, and comprises a transparent substrate 931 and a dimming film 932.

It is noteworthy that, compared with FIG. 9A, the second inclining mechanism TM' can be disposed outside the housing 900B. The second inclining mechanism TM' is coupled to the bottom of a containing mechanism of display device 900'. The second inclining mechanism TM' can be a jack, but is not limited by the present invention. The second inclining mechanism TM' aims to make the display device 900' in a tiltable state, and the user can adjust the display device 900' to be in a tiltable state according to different use requirements, so as to correspondingly change the inclination angle of the translucent module 930. Therefore, the display device 900' of the present embodiment can correspondingly provide a suitable display angle according to different use requirements.

Figure 10:
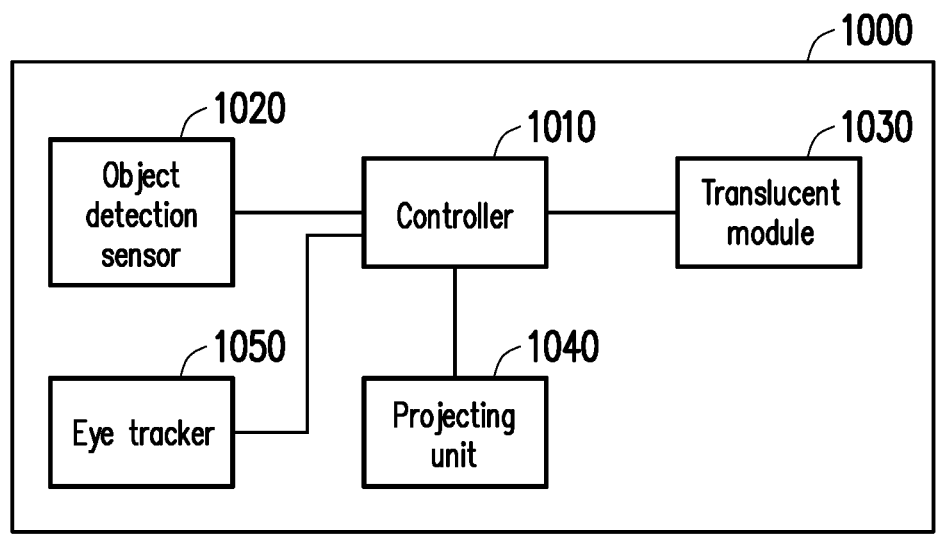
FIG. 10 is a block diagram indicating another display device of the present invention.

FIG. 10 is a block diagram indicating another display device of the present invention. Referring to FIG. 10, a display device 1000 comprises a controller 1010, an object detection sensor 1020, a translucent module 1030, a projecting unit 1040 and an eye tracker 1050. The controller 1000 is coupled to the object detection sensor 1020, the translucent module 1030, the projecting unit 1040 and the eye tracker 1050. In the present embodiment, the object detection sensor 1020 is configured to sense whether a moving object (for example, the user) exists in the periphery of the housing of the display device 1000, so as to output an object sensing signal to the controller 1010. When the object detection sensor 1020 senses that the moving object exists in the periphery of the housing of the display device 1000, the controller 1010 controls the projecting unit 1040 and the translucent module 1030 based on the object sensing signal, so as to project the projection picture to the outside of the housing of the display device 1000. That is, the display device 1000 of the present invention can selectively project the projection picture by determining whether the moving object exists in the periphery of the housing.

Compared with the embodiment of FIG. 1, the projecting unit 1040 of the present embodiment is a projecting light source. The translucent module 1030 can comprise a transparent display, so that the projecting unit 1040 projects projection light to the transparent display of the translucent module 1030. The transparent display of the translucent module 1030 generates corresponding image light to the projection surface, so that the projection picture is displayed on the projection surface. In addition, the display device 1000 of the present embodiment further comprises the eye tracker 1050. The eye tracker 1050 can be an infrared sensor or an eye tracking camera, etc., and not limited in the present invention. The eye tracker 1050 can automatically track an eyeball article of the moving object, for example, the eyes of the user. In the present embodiment, when the object detection sensor 1020 senses that the moving object exists in the first preset distance range away from the housing of the display device 1000, the controller 1010 controls the eye tracker 1050 to track the eyeball article of the moving object. The eye tracker 1050 can output an eye tracking signal to the controller 1010, so that the controller 1010 determines the content of the projection picture projected by the projecting unit 1040 according to the eye tracking signal. Moreover, other implementation modes and technical details about the display device 1050 of the present embodiment can refer to descriptions of the embodiment of FIG. 1 to obtain enough teachings, suggestions and implementation descriptions, and therefore, are omitted herein.

Figure 11:
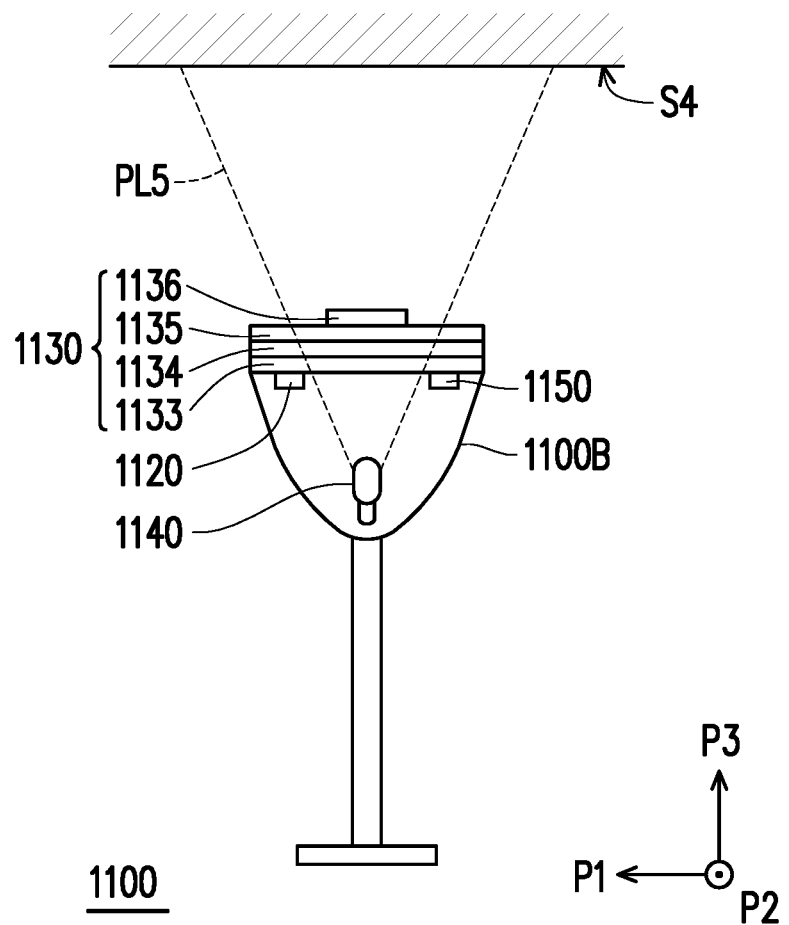
FIG. 11 is a schematic diagram indicating further another display device of the present invention.

FIG. 11 is a schematic diagram indicating further another display device of the present invention. Referring to FIG. 11, a display device 1100 comprises a housing 1100B, an object detection sensor 1120, a translucent module 1130, a projecting unit 1140 and an eye tracker 1150. The housing 1100B comprises a containing space. The display device 1100 can be disposed on a horizontal plane defined by a first direction P1 and a second direction P2. The first direction P1, the second direction P2 and a third direction P3 are mutually vertical to one another. In the present embodiment, the object detection sensor 1120 and the eye tracker 1150 are disposed on the display device 1100, particularly beside the housing 1100B or on the translucent module 1130, but the positions and quantities of the object detection sensor 1120 and the eye tracker 1150 on the display device 1100 are not limited in the present invention. In one embodiment, the display device 1100 can also comprise multiple object detection sensors or multiple eye trackers, which are disposed in the periphery of the housing 1100B by surrounding. In the present embodiment, the housing of the display device 1000 can be in a mechanism form of a floor lamp.

In the present embodiment, the translucent module 1130 is disposed on the surface of the housing 1100B, and comprises a first Fresnel lens 1133, a transparent display 1134, a second Fresnel lens 1135 and a focusing lens 1136. The projecting unit 1140 is disposed in the containing space of the housing 1100B and projects towards the third direction P3. The first Fresnel lens 1133 is disposed below the transparent display 1134, and adjacent to the transparent display 1134. The second Fresnel lens 1135 is disposed above the transparent display 1134, and adjacent to the transparent display 1134. The focusing lens 1136 is disposed above the second Fresnel lens 1135, and adjacent to the second Fresnel lens 1135. In the present embodiment, the focusing lens 1136 can be operated by the controller (not shown in the diagram) to move upwards or move downwards, so as to correspondingly adjust the focal length of the projection picture. The projection light projected by the projecting unit 1140 is sequentially transmitted to the first Fresnel lens 1133, the transparent display 1134, the second Fresnel lens 1135 and the focusing lens 1136, so that the transparent display 1134 emits corresponding image light to a projection surface S4, and the projection surface S4 displays the projection picture.

Specifically, when the object detection sensor 1120 senses that a moving object exists in the first preset distance range away from the housing 1100B, the object detection sensor 1120 outputs an object sensing signal to the controller (not shown in the diagram), and the controller controls the projecting unit 1140 and the transparent display 1135 of the translucent module 1130 based on the object sensing signal. That is, the display device 1100 can be a floor lamp with a projecting function. The transparent display 1135 of the display device 1100 can display a specific image picture, and receive projection light projected by the projecting unit 1140, so as to correspondingly emit image light to the projection surface S4, to make the projection surface S4 display a corresponding projection picture. In addition, the eye tracker 1150 of the display device 1100 can further track the eyeball article of the moving object, so that the controller can correspondingly adjust the content of the display picture based on determination on whether the eyeball article of the moving object stares at the display device 1100.

For example, when the display device 1100 determines that the user gets close to the housing 1100B, the display device 1100 can start a projection mode and project the projection picture on the ceiling, so that the display device 1100 can project a specific projection picture, for example, a background picture or a specific scenario picture, etc. on a corresponding area of the ceiling, which is not limited in the present invention. In addition, when the user stares at the display device 1100, the projection picture projected by the display device 1100 can be correspondingly changed to be a projection picture with specific information content, for example, weather information or various video information, etc., which is not limited in the present invention. Therefore, the display device 1100 of the present embodiment can correspondingly project the projection picture based on determination on whether the moving object exists in the periphery of the housing 1100B.

Moreover, in one embodiment, the display device 1100 can further comprise a lighting source (not shown in the diagram). When the object detection sensor 1120 senses that the moving object does not exist in the first preset distance range away from the housing 1100B, the controller enables the lighting source, so that the translucent module 1130 emits illuminating light. That is, if the user does not get close to the display device 1100, the display device 1100 provides a lighting function. Otherwise, if the user gets close to the display device 1100, the display device 1100 provides a projecting function. Therefore, in the present embodiment, the display device 1100 can also provide a lighting function.

Furthermore, in another embodiment, the display device 1100 can further comprise the image sensor, the sound player and the wireless communication unit described in the abovementioned embodiments, so as to match the image sensor, the sound player and the wireless communication unit to provide a projection picture with situated information content. For example, the display device 1100 can sense the gesture of the user by the image sensor to correspondingly adjust the content of the projection picture. The display device 1100 can synchronously play corresponding music or sound effect according to the content of the projection picture via the sound player. The display device 1100 can communicate with the external electronic device via the wireless communication unit. The wireless communication unit is configured to receive an operation instruction provided by the external electronic device, so that the controller of the display device 1100 can adjust the content of the projection picture projected by the projecting unit 1140 according to the operation instruction.

Figure 12:
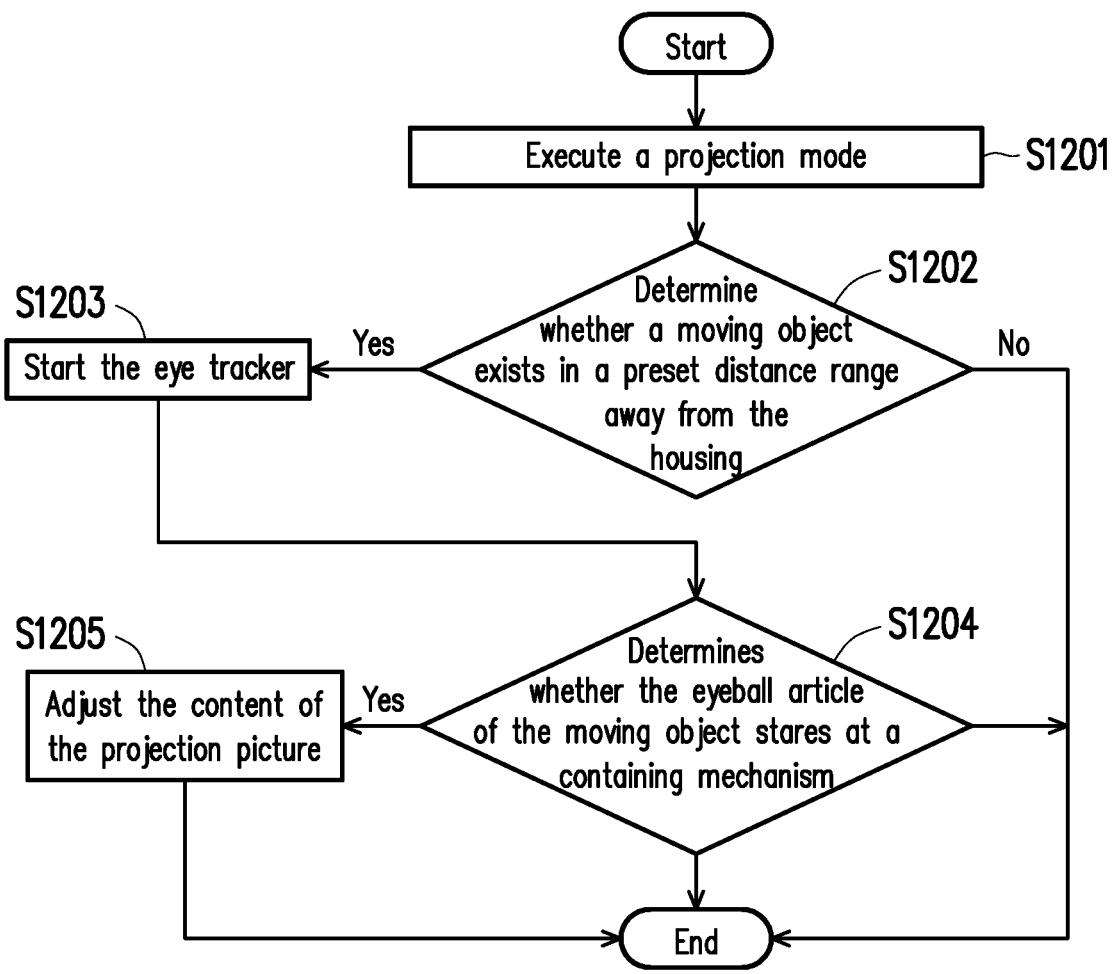
FIG. 12 is a flow diagram indicating another display method of the present invention.

FIG. 12 is a flow diagram indicating a display method of another embodiment of the present invention. Referring to FIG. 10 and FIG. 12, the display method of the present embodiment can be at least applicable to the display device 1000 of FIG. 10. In step S1201, the controller 1010 executes a projection mode. In step S1202, the controller 1010 determines whether a moving object exists in a preset distance range away from the housing of the display device 1100. If the controller 1010 determines that the moving object exists, the controller 1010 executes step S1203, so as to start the eye tracker 1050. If the controller 1010 determines that the moving object does not exist, the controller 1010 ends the projection mode or projects a general background picture or scenario picture. In addition, in step S1204, the controller 1010 determines whether the eyeball article of the moving object stares at the housing of the display device 1100 via the eye tracker 1050. If so, the controller 1010 correspondingly adjusts the content of the projection picture projected by the projecting unit 1040 according to the tracking result of the eyeball article. If not, the controller 1010 ends the projection mode or projects a general background picture or scenario picture. Therefore, the display device 1000 of the present embodiment can effectively determine whether the moving object exists in the periphery of the housing of the display device 1000, so as to provide a corresponding display effect. In addition, the display device 1000 of the present embodiment can track the eyeball article of the user, so as to effectively determine whether the user stares at the display device 1000, and flexibly adjust the content of the projection picture.

Moreover, other implementation modes and technical details about the display device 1000 of the present embodiment can refer to descriptions of the embodiments of FIG. 1 to FIG. 11 to obtain enough teachings, suggestions and implementation descriptions, and therefore, are omitted herein.

To sum up, the display method and display method of the present invention can effectively determine whether a moving object exists in the periphery of the display device, so as to correspondingly project a projection picture to the outside of the housing of the display device, for example, on the ceiling. In addition, the display device of the present invention can be, for example, a table with a multilayer display function or a display cabinet with a projecting function. The display device of the present invention can further display the projection picture on the top surface of the housing of the display device via a dimming film, so that the user can directly watch the projection picture through the top surface of the housing of the display device. Moreover, the display device of the present invention can also be, for example, a floor lamp with a projecting function. When the display device of the present invention projects the projection picture to the ceiling, and the moving object exists in the periphery of the display device, the display device of the present invention can track the eyeball article of the moving object via the eye tracker, so as to correspondingly adjust the content of the projection picture. Therefore, the display device of the present invention can provide multiple display effects and good user experience.

Although the present invention has been disclosed above through the embodiments, the embodiments are not intended to limit the present invention, any person of ordinary skill in the art can make some alternation and modification without deviating from the spirit and scope of the present invention, and therefore, the protection scope of the present invention should be subject to the appended claims.

What is claimed is:

1. A display device, comprising:
   a housing, comprising a containing space;
   a translucent module, disposed on a surface of the housing and comprising a dimming film;
   a projecting unit, disposed in the containing space, and coupled to a controller, wherein the projecting unit is configured to project projection light to the translucent module; and
   an object detection sensor, disposed on the display device and coupled to the controller,
   wherein when the object detection sensor senses that a moving object exists between a first preset distance range and a second preset distance range away from the housing, the object detection sensor outputs an object sensing signal to the controller, and the controller controls the projecting unit and the translucent unit based on the object sensing signal to operate the dimming film in a translucent state, and the projecting unit projects the projection light to penetrate the translucent module, so as to project a projection picture to the outside of the housing, wherein the first preset distance range is greater than the second preset distance range.

2. The display device according to claim 1, wherein the projecting unit is a projector, the translucent module comprises a transparent substrate, the dimming film is disposed below the transparent substrate, and when the projection light penetrates the transparent substrate to be projected to a projection surface, the projection surface displays the projection picture.

3. The display device according to claim 2, wherein when the object detection sensor senses that a moving object exists in the second preset distance range away from the housing, the dimming film operates in a non-transparent state, and the projecting unit projects the projection to the dimming film.

4. The display device according to claim 2, wherein the translucent module comprises a pressure sensor, and the pressure sensor is coupled to the controller,
   when the pressure sensor senses that an article is loaded on the translucent module, the pressure sensor outputs a pressure sensing signal to the controller, and the controller controls the projecting unit based on the pressure sensing signal, and correspondingly adjusts a projection range of the projecting unit to keep away from the article.

5. The display device according to claim 2, further comprising:
   a medium releaser, configured to provide a refracting medium,
   wherein the refracting medium receives the projection light projected by the projecting unit, so as to display a stereoscopic projection picture.

6. The display device according to claim 5, wherein the medium releaser is disposed in the containing space, and the medium releaser releases the refracting medium in the containing space, so that the stereoscopic projection picture is displayed in the containing space.

7. The display device according to claim 5, wherein the medium releaser is disposed on the translucent module, and the medium releaser releases the refracting medium outside the housing, so that the stereoscopic projection picture is displayed outside the housing and above the translucent module.

8. The display device according to claim 1, wherein the projecting unit is vertically disposed in the containing space, and the projecting unit projects the projection light towards a vertical direction.

9. The display device according to claim 1, further comprising:
a reflecting member, disposed at the bottom side of the containing space,
wherein the projecting unit is horizontally disposed in the containing space, and the projecting unit projects the projection light towards a horizontal direction to the reflecting member, so that the projection light is reflected to a vertical direction via the reflecting member.

10. The display device according to claim 1, wherein an inclination angle is formed between the translucent module and a horizontal plane.

11. The display device according to claim 10, further comprising:
a first inclining mechanism, disposed in the containing space, and coupled to the translucent module and one side face of the housing, wherein the first inclining mechanism is configured to adjust the inclination angle of the translucent module.

12. The display device according to claim 10, further comprising:
a second inclining mechanism, disposed outside the housing, and coupled to a bottom of the housing, wherein the second inclining mechanism is configured to incline the housing, so as to correspondingly adjust the inclination angle of the translucent module.

13. The display device according to claim 1, further comprising:
a sound player, coupled to the controller and configured to correspondingly output sound information based on the content of the projection picture.

14. The display device according to claim 1, further comprising:
an image sensor, disposed in the containing space and coupled to the controller,
wherein when the image sensor senses a gesture on the translucent module, the image sensor outputs a gesture image to the controller, so that the controller analyzes the gesture image to correspondingly adjust the content of the projection picture.

15. The display device according to claim 1, further comprising:
a wireless communication circuit, coupled to the controller, and configured to receive an operation instruction provided by an external electronic device, so as to enable the controller to adjust the content of the projection picture according to the operation instruction.

16. The display device according to claim 1, wherein the projecting unit is a projecting light source, the translucent module comprises a transparent display, and when the projecting unit projects the projection light to the transparent display, the transparent display emits image light to a projection surface, so that the projection surface displays the projection picture.

17. The display device according to claim 16, wherein the translucent module further comprises:
a first Fresnel lens, disposed below the transparent display and adjacent to the transparent display;
a second Fresnel lens, disposed above the transparent display and adjacent to the transparent display; and
a focusing lens, disposed above the second Fresnel lens and adjacent to the second Fresnel lens,
wherein the projection light projected by the projecting unit is sequentially transmitted to the first Fresnel lens, the transparent display, the second Fresnel lens and the focusing lens, so as to generate the image light.

18. The display device according to claim 17, wherein the focusing lens is operated by the controller to move upwards or move downwards, so as to correspondingly adjust a focal length of the projection picture.

19. The display device according to claim 1, further comprising:
an eye tracker, disposed on the display device and coupled to the controller,
wherein when the object detection sensor senses that the moving object exists in the first preset distance range away from the housing, the controller controls the eye tracker to track an eyeball article of the moving object, and the eye tracker outputs an eye tracking signal to the controller, so as to enable the controller to determine the content of the projection picture according to the eye tracking signal.

20. The display device according to claim 19, wherein when the eye tracker tracks that the eyeball article of the moving object stares at the housing, the controller adjusts the content of the projection picture.

21. The display device according to claim 1, further comprising:
a lighting source, disposed on the display device and coupled to the controller,
wherein when the object detection sensor senses that the moving object does not exist he first preset distance range away from the housing, the controller enables the lighting source to emit illuminating light via the translucent module.

22. A display method, applicable to a display device, the display device comprising a housing, a translucent module, a projecting unit and an object detection sensor, wherein the display method comprises:
sensing, by the object detection sensor, whether a moving object exists between a first preset distance range and a second preset distance range away from the housing;
outputting, by the object detection sensor, an object sensing signal to a controller when the object detection sensor senses that the moving object exists between the first preset distance range and the second preset distance range away from the housing; and
controlling, by the controller, the projecting unit and the translucent module according to the object sensing signal to operate a dimming film in a translucent state, and the projecting unit projects the projection light to penetrate the translucent module, so as to project a projection picture to the outside of the housing, wherein the first preset distance range is greater than the second preset distance range.

23. The display method according to claim 22, wherein the display method further comprises:
sensing, by the object detection sensor, whether the moving object exists in the second preset distance range away from the housing; and
operating the dimming film in a non-transparent state and controlling the projecting unit to project the projection light to the dimming film when the object detection sensor senses that the moving object exists in the second preset distance range away from the housing.

24. The display method according to claim 22, wherein the translucent module comprises a pressure sensor, and the display method further comprises:

outputting, by the pressure sensor, a pressure sensing signal to the controller when the pressure sensor senses that an article is loaded on the translucent module; and controlling, by the controller, the projecting unit based on the pressure sensing signal, and correspondingly adjusting a projection range of the projecting unit to keep away from the article.

25. The display method according to claim 22, wherein the projecting unit is a projection light source, the translucent module comprises a transparent display, and when the projecting unit projects the projection light to the transparent display, the transparent display emits image light to a projection surface, so that the projection surface displays the projection picture.

26. The display method according to claim 25, wherein the display device further comprises an eye tracker, and the display method further comprising:

starting the eye tracker when the object detection sensor senses that the moving object exists in the first preset distance range away from the housing; and determining, by the eye tracker, whether an eyeball article of the moving object stares at the housing, so as to determine the content of the projection picture.

27. The display method according to claim 26, wherein the step of determining, by the eye tracker, whether the eyeball article of the moving object stares at the housing, so as to determine the content of the projection picture comprises:

controlling, by the controller, the eye tracker to track an eyeball article of the moving object; and outputting, by the eye tracker, an eye tracking signal to the controller, so as to enable the controller to determine the content of the projection picture according to the eye tracking signal.

\* \* \* \* \*